(12) United States Patent
Tsukude et al.

(10) Patent No.: US 6,697,910 B2
(45) Date of Patent: Feb. 24, 2004

(54) SEMICONDUCTOR MEMORY DEVICE HAVING REFRESH CIRCUIT

(75) Inventors: Masaki Tsukude, Hyogo (JP); Shinichi Kobayashi, Hyogo (JP); Hirotoshi Sato, Hyogo (JP)

(73) Assignee: Renesos Technology Corp., Tokyo (JP)

( * ) Notice: Subject to any disclaimer, the term of this patent is extended or adjusted under 35 U.S.C. 154(b) by 21 days.

(21) Appl. No.: 09/987,895

(22) Filed: Nov. 16, 2001

(65) Prior Publication Data
US 2002/0178323 A1 Nov. 28, 2002

(30) Foreign Application Priority Data
May 28, 2001 (JP) .................................. 2001-158365

(51) Int. Cl.[7] .............................................. G06F 12/00
(52) U.S. Cl. ...................................................... 711/106
(58) Field of Search .......................... 711/106; 365/222

(56) References Cited
U.S. PATENT DOCUMENTS 5,345,574 A * 9/1994 Sakurada et al. ............ 711/115
5,345,577 A * 9/1994 Chan et al. .................. 711/106
2001/0008496 A1 * 7/2001 Leung ......................... 365/223
2002/0147885 A1 * 10/2002 Mobley ....................... 711/106
2002/0159318 A1 * 10/2002 Arimoto et al. ............. 365/203

OTHER PUBLICATIONS

Sawada, et al., "*A 30-μA Data-Retention Pseudostatic RAM with Virtually Static RAM Mode*," Feb. 1988, pp. 12–19, IEEE Journal of Solid-State Circuits, vol. 23, No. 1.

* cited by examiner

*Primary Examiner*—Hiep T. Nguyen
(74) *Attorney, Agent, or Firm*—McDermott, Will & Emery (57) ABSTRACT

In a semiconductor memory device, a refresh circuit outputs a refresh command signal for executing refresh operation. The refresh circuit includes a command-signal activating circuit for activating the refresh command signal, and a determination circuit for determining whether the activated refresh command signal is to be output. The determination circuit determines that the activated refresh command signal is to be output when the semiconductor memory device is in a standby state. Thereby, the semiconductor memory device enables stable refresh operation to be executed.

11 Claims, 7 Drawing Sheets

SEMICONDUCTOR MEMORY DEVICE HAVING REFRESH CIRCUIT

BACKGROUND OF THE INVENTION

1. Field of the Invention

The present invention relates to a semiconductor memory device, particularly to a dynamic random access memory capable of performing refresh operation independently of input signals externally supplied (which will hereinbelow be referred to as a "complete-hidden-refresh-function-included DRAM").

2. Description of the Background Art

In a field of portable terminals such as portable telephones, there is widely used an asynchronous general-purpose static ramdom access memory (which will hereinbelow referred to as "SRAM") for which external clocks need not be supplied. In the SRAM, since refresh operation need not be performed, complex control need not be performed. For example, the SRAM need not perform control access that is made to the memory in refresh operation by awaiting completion of a refresh cycle. For this reason, with the SRAM being used, since the system configuration can be simplified, the SRAM is therefore suitable for use with the portable terminal.

Recently, the function of portable terminal has been significantly improved, and the terminal requires large scale memory functions. However, the SRAM has memory which is about 10 times that of a dynamic ramdom access memory (which hereinbelow will be referred to as a "DRAM"). For a large-scale SRAM, the cost for the memory chip is significantly increased, and consequently, the price of the portable terminal is increased. To overcome the problem, a new technical scheme was conceived in which, instead of the SRAM, a DRAM of which memory cost per unit bit is relatively lower is used with the portable terminal.

However, the DRAM requires complex memory control relative to refresh operation. For portable-terminal manufacturers that hitherto have been engaged in design of systems using SRAMs as memories, it is not easy to use DRAMs as substitutive memories of SRAMs.

Under these circumstances, many semiconductor manufacturers have begun the development of a new semiconductor memory device. The new memory device is formed of a DRAM, but it operates as a SRAM in terms of external functions. A semiconductor memory device of the new type is reported in the publication "Kazuhiro Sawada, IEEE JOURNAL OF SOLID-STATE CIRCUITS, Vol. 23, No. 1, February 1998, (pp.12–19)".

In the new semiconductor memory device, the same memory cells as those used in the DRAM are used. On the other hand, external interfaces, such as control signals and address signals to be input to the semiconductor memory device, are the same as those to be input to the SRAM. However, different from refresh operation or self-refresh operation of the conventional DRAM, refresh operation of the new semiconductor memory device is not controlled by signals received from an external source. In specific, the refresh operation is controlled by a refresh command signal /REFE that is cyclically output from a refresh circuit provided in the complete-hidden-refresh-function-included DRAM. The refresh circuit includes a ring oscillator as a timer circuit, and outputs refresh command signal /REFE in response to a cycle signal /Refcyc that is cyclically output from the timer circuit. Since the timer circuit thus outputs cycle signal /Refcyc all the time, the semiconductor memory device of the new type cyclically executes refresh operation either in an operation state where read operation or write operation is executable or in a standby state.

Based on the function, the new semiconductor memory device hereinbelow will be referred to as a "complete-hidden-refresh-function-included DRAM". The development of the complete-hidden-refresh-function-included DRAM satisfies requirements for improvement in the function of portable terminals.

As described above, however, in the complete-hidden-refresh-function-included DRAM, the refresh operation is executed either in the operation state or in the standby state. In this case, a malfunction can occur when refresh command signal /REFE and a write-or-read operation request signal are activated with the same timing.

Figure 8:
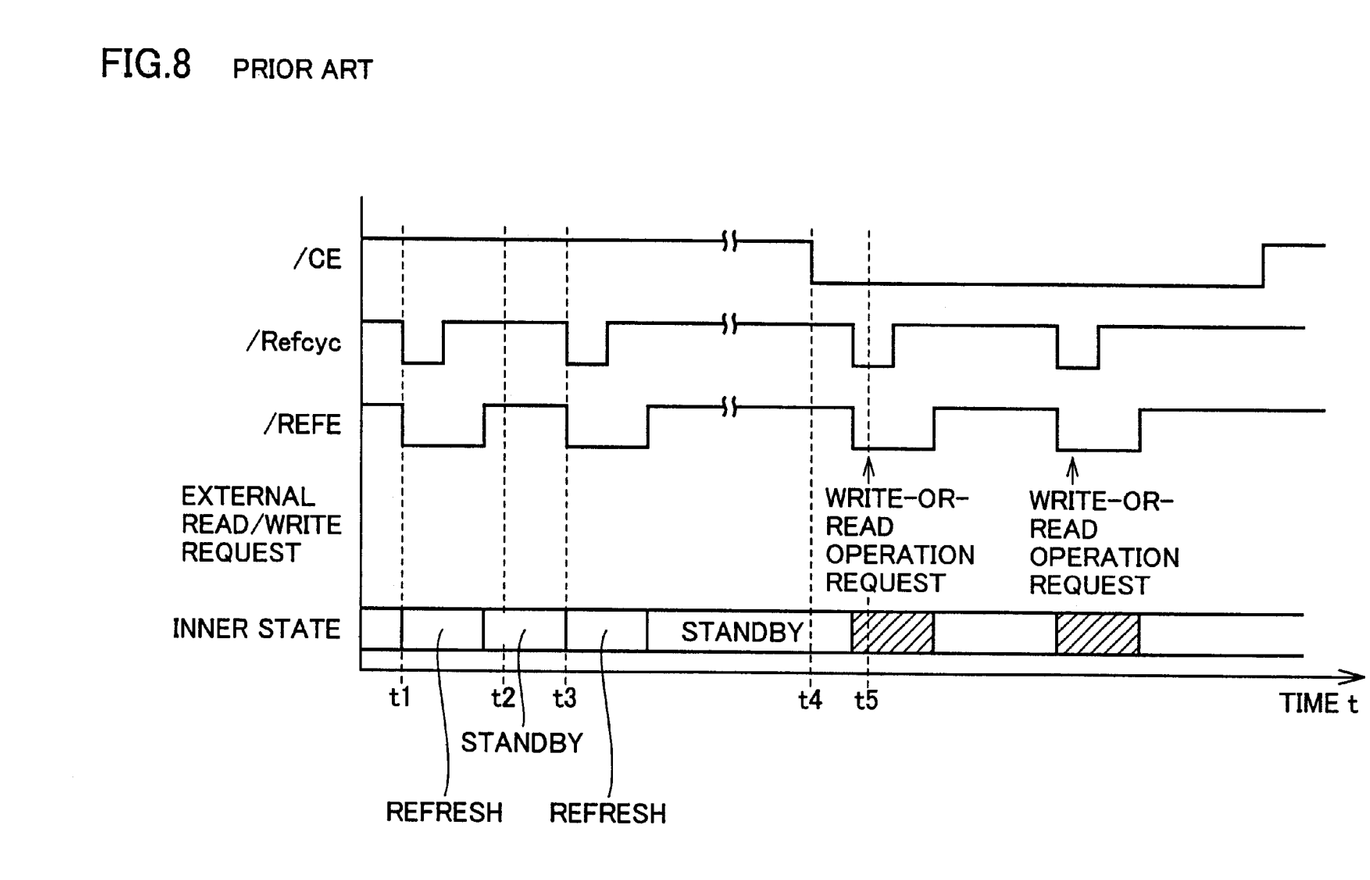
FIG. 8 is a timing chart representing a case where a malfunction occurs in a conventional complete-hidden-refresh-function-included DRAM.

FIG. 8 is a timing chart representing a case where a malfunction occurs in a conventional complete-hidden-refresh-function-included DRAM.

Referring to FIG. 8, a chip enable signal /CE is a control signal externally input. When chip enable signal /CE is active, the complete-hidden-refresh-function-included DRAM is in an operation state. When chip enable signal /CE is inactive, the complete-hidden-refresh-function-included DRAM is in a standby state.

In the timing chart shown in FIG. 8, since chip enable signal /CE is inactive (H level) before a time t4, the complete-hidden-refresh-function-included DRAM enters the standby state. In the standby state, at a time t1 and a time t3, refresh command signal /REFE is activated in response to cycle signal /Refcyc, and refresh operation is executed. On the other hand, at a time t2 whereat cycle signal /Refcyc is inactive, since refresh command signal /REFE is inactive, the complete-hidden-refresh-function-included DRAM does not perform refresh operation.

Subsequently, when chip enable signal /CE becomes active (L level) at time t4, the complete-hidden-refresh-function-included DRAM enters the operation state.

In the above, similarly to the case of a time t5, in the activation of refresh command signal /REFE, a case can occur in which a write-or-read operation request signal is externally input. In this case, the complete-hidden-refresh-function-included DRAM causes a malfunction.

To prevent such a malfunction, a conventional complete-hidden-refresh-function-included DRAM has an arbitration circuit.

The arbitration circuit compares the synchronous signals, namely, refresh command signal /REFE and the externally input write-or-read operation request signal, and arbitrates the operational priority thereof. In practice, when refresh command signal /REFE and the write-or-read operation request signal have been activated with the same timing, the arbitration circuit carries out arbitration in such a manner that operation of one of the signals which is activated earlier is executed earlier, and operation of the other one of the signals is then executed.

Because of the above configuration, even when refresh command signal /REFE and the write-or-read operation request signal are activated with the same timing, malfunction of the complete-hidden-refresh-function-included DRAM can be prevented to a certain extent.

However, in the case where the arbitration circuit performs arbitration such that the write-or-read operation is executed after the refresh operation, the probability of delay in access speed is thereby increased. In addition, when refresh command signal /REFE and the write-or-read operation request signal are activated with exactly the same timing, arbitration therefor cannot be achieved by the arbitration circuit.

Because of the above-described problems, the conventional complete-hidden-refresh-function-included DRAM encounters difficulties in ensuring the stability in the refresh operation.

SUMMARY OF THE INVENTION

An object of the present invention is to provide a semiconductor memory device that can be set to an operation state in which read/write operation for data is executable and a standby state in which the data is retained and that enables the stability of refresh operation to be ensured.

A semiconductor memory device of the present invention can be set either to an operation state where a read operation or a write operation for data is executable or to a standby state where the data is retained. The semiconductor memory device includes a memory cell array including a plurality of memory cells arranged in a matrix, and a complete hidden refresh circuit for performing refreshing operation without being externally commanded for the data stored in the plurality of memory cells. The complete hidden refresh circuit executes the refresh operation according to the condition of the semiconductor memory device.

The complete hidden refresh circuit preferably executes the refresh operation when the semiconductor memory device is in the standby state.

In the semiconductor memory device arranged as above, the refresh operation and a write-or-read operation are not executed with the same timing.

In addition, the complete hidden refresh circuit preferably executes the refresh operation after completion of the read operation of the semiconductor memory device.

Furthermore, the complete hidden refresh circuit preferably executes the refresh operation after completion of the write operation of the semiconductor memory device.

In the semiconductor memory device arranged as above, the refresh operation is not executed during one of the read operation and write operation.

Still furthermore, the complete hidden refresh circuit preferably includes a refresh circuit for outputting a refresh command signal for execution of the refresh operation, and a control circuit for executing the refresh operation in response to the refresh command signal. The refresh circuit preferably includes a timer circuit for outputting a cycle signal at a time interval necessary for refreshing data stored in the plurality of memory cells, a command-signal activating circuit for activating the refresh command signal in response to the cycle signal, and a determination circuit for determining as to whether or not the refresh command signal activated is to be output.

Still furthermore, the determination circuit preferably determines that the refresh command signal activated is to be output when the semiconductor memory device is in the standby state.

In the semiconductor memory device arranged as above, the refresh operation and a write-or-read operation are not executed with the same timing.

Still furthermore, the determination circuit preferably determines that the refresh command signal activated is to be output after the semiconductor memory device has completed the read operation.

Still furthermore, the determination circuit preferably determines that the refresh command signal activated is to be output after the semiconductor memory device has completed the write operation.

In the above-described semiconductor memory device, the refresh operation is performed after completion of the write-or-read operation. Consequently, the write-or-read operation and the refresh operation are not executed with the same timing, thereby enabling stabilized refresh operation to be executed.

According to the present invention described above, the semiconductor memory device including the complete hidden refresh function is capable of preventing refresh operation and read-or-write operation from being executed with the same timing. Furthermore, this reduces the probability at which access is delayed in read-or-write operation. Still furthermore, the stability in refresh operation can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinbelow, embodiments will be described in detail referring to the drawings. In the drawings, portions identical to or equivalent to each other are represented by identical numerals or symbols, and description of the portions will not be repeated.

[First Embodiment]

Figure 1:
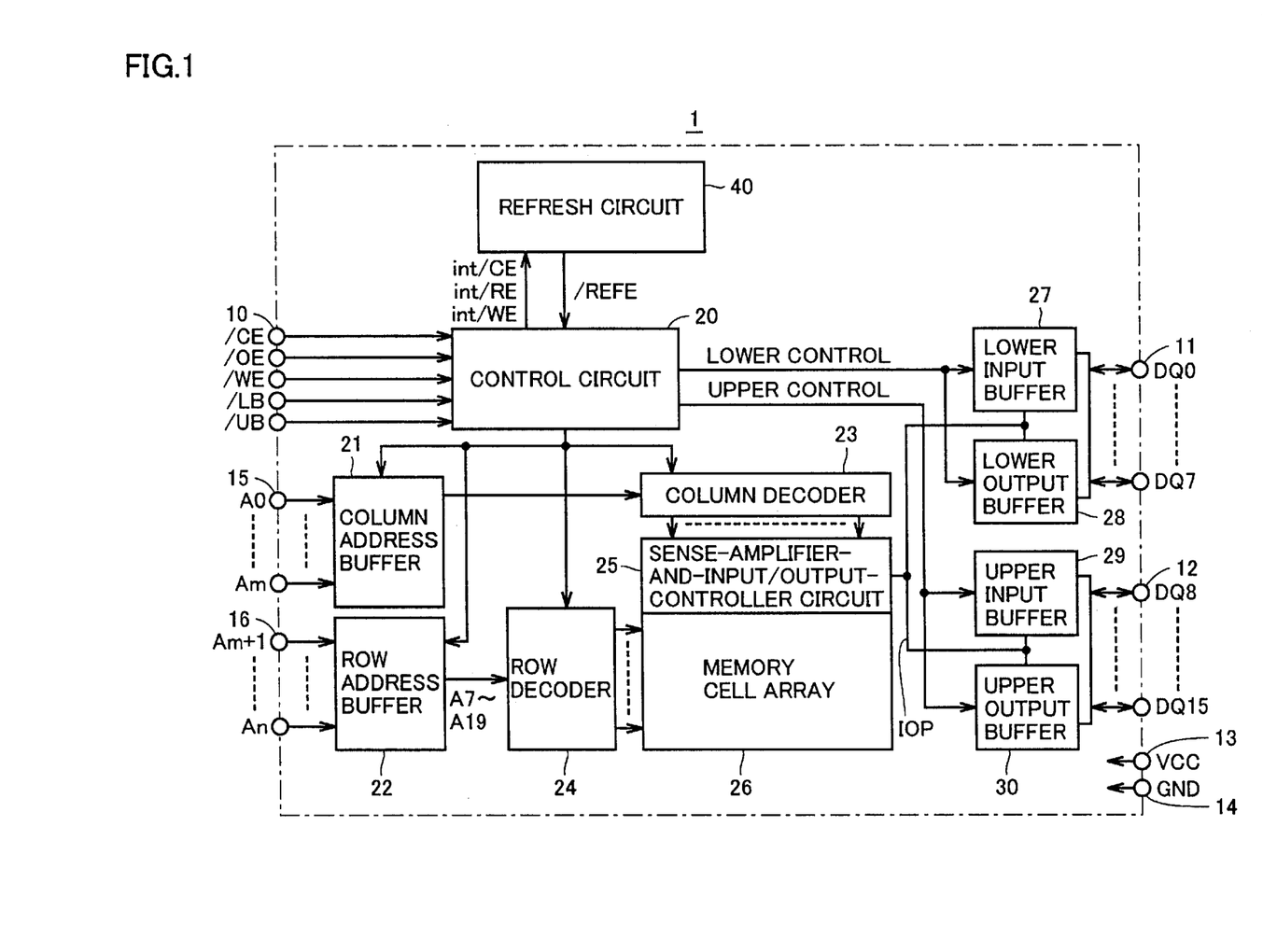
FIG. 1 is an overall configuration view of a complete-hidden-refresh-function-included DRAM according to a first embodiment of the present invention.

FIG. 1 is an overall configuration view of a complete-hidden-refresh-function-included DRAM according to the first embodiment of the present invention.

Referring to FIG. 1, complete-hidden-refresh-function-included a DRAM 1 includes an input terminal group 10, an input terminal group 11, a terminal group 12, an input terminal group 15, an input terminal group 16, a power terminal 13, and a ground terminal 14. Input terminal group 10 receives control signals, namely, a chip enable signal /CE, an output enable signal /OE, a write enable signal /WE, a control signal /LB, and a control signal /UB. Input terminal group 11 inputs data signals DQ0 to DQ7 and/or outputs them. Input terminal group 12 inputs data signals DQ8 to DQ15 and/or outputs the same. Input terminal group 15 inputs address signals A0 to $A_m$ ("m" represents 1 or a larger natural number). Input terminal group 16 inputs address signals $A_{m+1}$ to $A_n$ ("n" represents 1 or a larger natural number). Power terminal 13 receives a power-supply voltage VCC. Ground terminal 14 is given a ground voltage GND.

Chip enable signal /CE controls complete-hidden-refresh-function-included DRAM to be active. Output enable signal /OE sets complete-hidden-refresh-function-included DRAM to a read mode, and concurrently activates an output buffer. Write enable signal /WE sets complete-hidden-refresh-function-included DRAM to a write mode. Control signal /LB selects the operation of inputting data to input terminal group 12 on a lower bit side and/or outputting data therefrom. Control signal /UB selects the operation of inputting data to input terminal group 11 on an upper bit side and/or outputting data therefrom.

Complete-hidden-refresh-function-included DRAM further includes a control circuit 20, a column address buffer 21, and a row address buffer 22. In response to the control signals that have been input from input terminal group 11, control circuit 20 outputs to individual blocks control clocks corresponding to predetermined operation modes, such as the write mode and the read mode, of the complete-hidden-refresh-function-included DRAM. In response to outputs of control circuit 20, column address buffer 21 receives address signals A0 to $A_m$ and transfers them to the inside. In response to outputs of control circuit 20, column address buffer 22 receives address signals $A_{m+1}$ to $A_n$ and transfers them to the inside.

Complete-hidden-refresh-function-included DRAM further includes a column decoder 23, a row decoder 24, a memory cell array 26, and a sense amplifier-and-input/output-controller circuit 25. In response to outputs of control circuit 20, column decoder 23 receives internal address signals that have been output from column address buffer 21, and specifies column addresses. In response to outputs of control circuit 20, row decoder 24 receives internal address signals that have been output from column address buffer 22, and specifies row addresses. Memory cell array 26 includes memory cells arranged in a matrix. Sense-amplifier-and-input/output-controller circuit 25 amplifies outputs from memory cell array 26, and performs read operation.

Complete-hidden-refresh-function-included DRAM further includes a lower input buffer 27, a lower output buffer 28, an upper input buffer 29, and an upper output buffer 30. In response to outputs of control circuit 20, the lower input buffer 27 receives data signals DQ0 to DQ7 from input terminal group 11, and transfers them to sense-amplifier-and-input/output-controller circuit 25. In response to outputs of control circuit 20, lower output buffer 28 receives signals from sense-amplifier-and-input/output-controller circuit 25, and outputs data signals to input terminal group 11. In response to outputs of control circuit 20, upper input buffer 29 receives data signals DQ8 to DQ15 from terminal group 12, and transfers them to sense-amplifier-and-input/output-controller circuit 25. In response to outputs of control circuit 20, upper output buffer 30 receives signals from sense-amplifier-and-input/output-controller circuit 25, and outputs data signals to terminal group 12.

Complete-hidden-refresh-function-included DRAM further includes a refresh circuit 40. Refresh circuit 40 outputs a signal that is cyclically activated, namely, a refresh command signal /REFE, to control circuit 20. Upon receipt of refresh command signal /REFE, control circuit 20 outputs operation command signals to individual blocks for execution of refresh operation.

Figure 2:
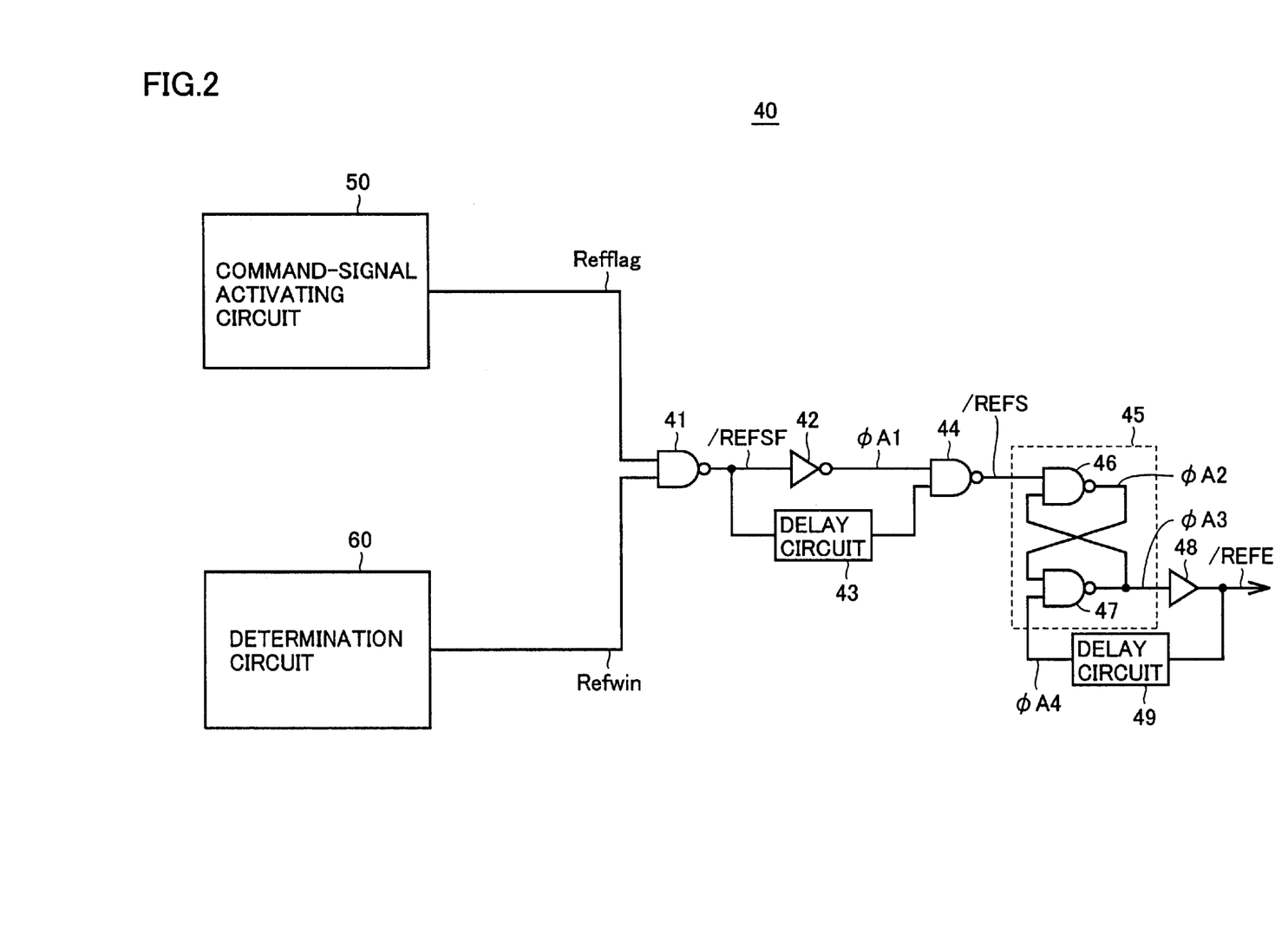
FIG. 2 is a circuit diagram of a refresh circuit 40 shown in FIG. 1.

FIG. 2 is a circuit diagram of refresh circuit 40 shown in FIG. 1.

Referring to FIG. 2, refresh circuit 40 includes a command-signal activating circuit 50, a determination circuit 60, NAND gates 41 and 44, an inverter 42, a buffer 48, delay circuits 43 and 49, and a flip-flop 45.

Command-signal activating circuit 50 outputs a refresh flag signal Refflag to activate refresh command signal /REFE. Determination circuit 60 outputs a determination signal Refwin that determines as to whether or not refresh command signal /REFE activated by refresh flag signal Refflag needs to be output.

NAND gate 41 receives refresh flag signal Refflag and determination signal Refwin and performs operations to generate a logical product of these signals. As a result, it outputs a signal obtained through inversion of the operation result as a signal /REFSF.

Inverter 42 receives signal /REFSF, which has been output from NAND gate 41, and outputs a signal obtained through inversion as a signal $\phi$A1. A delay circuit 43 receives signal /REFSF, and delays it by a specific period of time.

NAND gate 44 receives an output signal $\phi$A1 of inverter 42 and an output signal of delay circuit 43, and performs operations to generate a logical product of these signals. As a result, it outputs a signal obtained through inversion of the operation result as a signal /REFS.

Flip-flop 45 is formed to include NAND gates 46 and 47. NAND gate 46 receives signal /REFS and an output signal $\phi$A3, which has been output from NAND gate 47, and performs operations to generate a logical product of these signals. As a result, it outputs a signal $\phi$A2 obtained through inversion of the operation result. NAND gate 47 receives a signal $\phi$A2, which has been output from NAND gate 46. It also receives a signal $\phi$A4 output from a delay circuit 49, and performs operations to generate a logical product of signal $\phi$A2 and signal $\phi$A4. As a result, it outputs a signal obtained through inversion of the operation result as a refresh command signal /REFE.

Delay circuit 49 receives refresh command signal /REFE, which has been output from flip-flop 45, and outputs signal $\phi$A4 delayed by a specific period of time.

Buffer 48 receives output signal $\phi$A3 and outputs refresh command signal /REFE.

Figure 3:
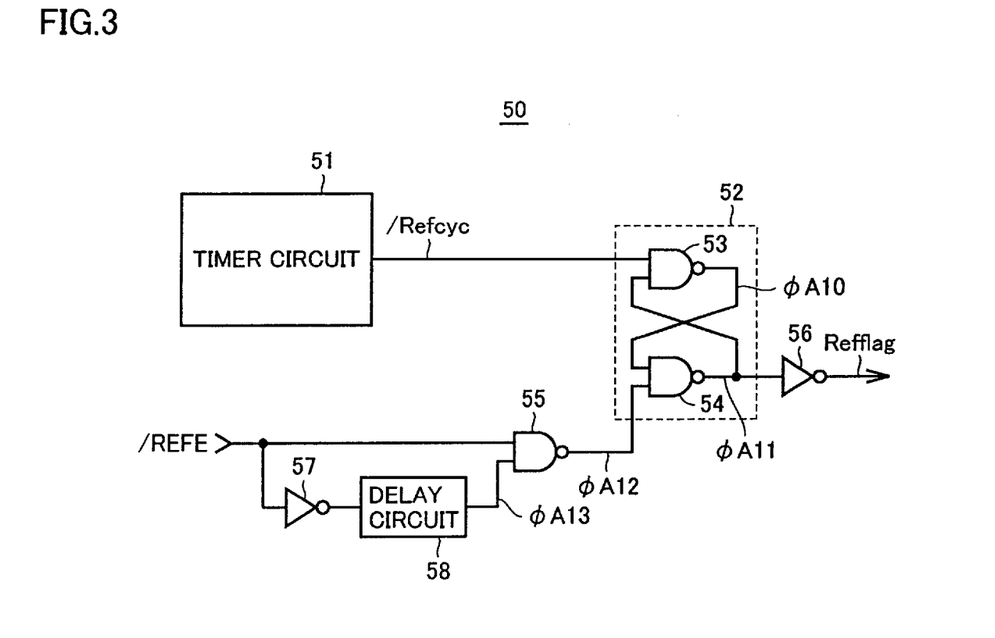
FIG. 3 is a circuit diagram of a command-signal activating circuit 50 shown in FIG. 2.

FIG. 3 is a circuit diagram of command-signal activating circuit 50 shown in FIG. 2.

Referring to FIG. 3, command-signal activating circuit 50 includes a timer circuit 51 that is formed of a ring oscillator and that outputs a cycle signal /Refcyc cyclically activated, a flip-flop 52, NAND gate 55, inverters 56 and 57, and a delay circuit 58.

Flip-flop 52 is formed of NAND gates 53 and 54. NAND gate 53 receives cycle signal /Refcyc and an output signal $\phi$A11 of NAND gate 54, performs operations to generate a logical product of these signals, and outputs a signal $\phi$A10 through inversion of the operation result. NAND gate 54 receives output signal $\phi$A10, which has been output from NAND gate 53, and an output signal $\phi$A12, which has been output from a NAND gate 55. Then, it performs operations to generate a logical product of these signals, and outputs output signal $\phi$A11 obtained through inversion of the operation result.

Inverter 56 receives output signal $\phi$A11, which has been output from flip-flop 52, inverts it, and outputs the inverted signal as refresh flag signal Refflag.

Inverter 57 receives refresh command signal /REFE and inverts it. Delay circuit 58 receives refresh command signal /REFE, which has been inverted by inverter 57, and outputs a signal φA13 obtained such that the inverted refresh command signal /REFE is delayed by a specific period of time.

NAND gate 55 receives refresh command signal /REFE and signal φA13, which has been output from delay circuit 58, performs operations to obtain a logical product of these signals, and outputs output signal φA12, which has been obtained through inversion of the operation result.

Figure 4:
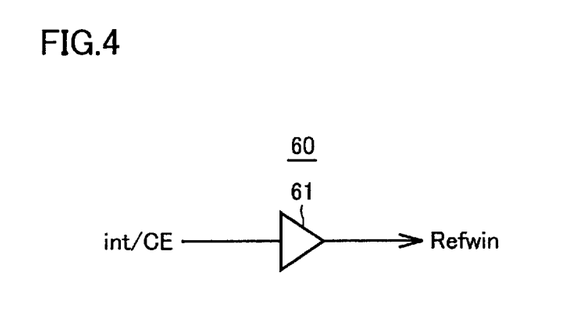
FIG. 4 is a circuit diagram of a determination circuit 60 shown in FIG. 2.

FIG. 4 is a circuit diagram of determination circuit 60 shown in FIG. 2.

Referring to FIG. 4, determination circuit 60 is formed of a buffer circuit 61. Buffer circuit 61 receives an internal chip enable signal int./CE, and outputs determination signal Refwin. Internal chip enable signal int./CE is generated by control circuit 20 from chip enable signal /CE, which has been received from input terminal group 10.

Hereinbelow, operation of refresh circuit 40 having the above-described circuit configuration will be described.

Figure 5:
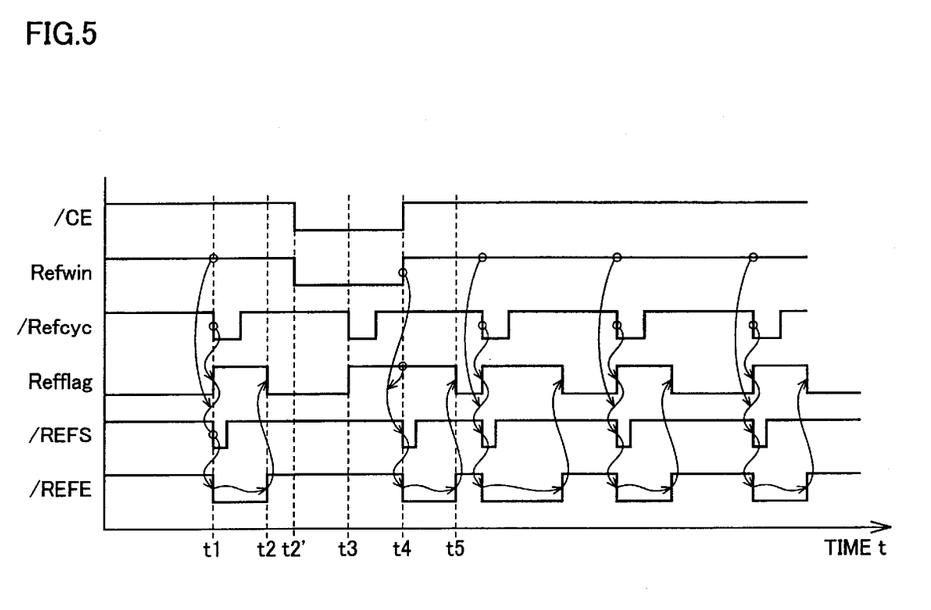
FIG. 5 is a timing chart representing operation of refresh circuit 40.

FIG. 5 is a timing chart representing operation of the refresh circuit 40.

Referring to FIG. 5, when chip enable signal /CE input from input terminal group 10 is inactive, determination circuit 60 determines that refresh operation is executable. That is, determination circuit 60 determines that refresh circuit 40 has been enabled to output refresh command signal /REFE. Consequently, when chip enable signal /CE is inactive, determination signal Refwin that is output from determination circuit 60 becomes active.

At this stage, when a cycle signal /Refcyc that is output from timer circuit 51 is activated at a time t1, refresh flag signal Refflag that is output from command-signal activating circuit 50 is activated.

Consequently, NAND gate 41 in refresh circuit 40 receives determination signal Refwin and activated refresh flag signal Refflag, and activates signal /REFSF. NAND gate 44 outputs signal /REFS activated within the specific period of time set by delay circuit 43.

Flip-flop 45 receives activated signal /REFS, and outputs signal φA3 activated within the specific period of time set by delay circuit 49. Buffer 48 receives output signal φA3, and outputs refresh command signal /REFE activated within a specific period of time from time t1.

As a result of the above-described operations, when refresh flag signal Refflag output from command-signal activating circuit 50 is activated at time t1, determination circuit 60 determines that refresh operation is executable. That is, at time t1, determination circuit 60 determines that determination signal Refwin is active. Thereby, when complete-hidden-refresh-function-included DRAM is in a standby state, refresh operation is executable.

Refresh command signal /REFE that is output from refresh circuit 40 is deactivated at a time t2, which is a time point after passage of a specific period of time set by delay circuit 49. At this time, since the level of output signal φA12 that is output from NAND gate 55 in command-signal activating circuit 50 is shifted to an L level, refresh flag signal Refflag that is output from the command-signal activating circuit 50 is deactivated accordingly.

Subsequently, at a time t2', chip enable signal /CE becomes active. In this case, determination circuit 60 determines that refresh operation is not executable, and therefore deactivates determination signal Refwin that is output therefrom.

At a time t3, when cycle signal /Refcyc, which is cyclically activated, is activated, refresh flag signal Refflag that is output from command-signal activating circuit 50 is also activated.

However, since determination signal Refwin that is output from determination circuit 60 remains inactive, signal /REFS that is output from NAND gate 44 also remains inactive. Consequently, refresh command signal /REFE that is output from refresh circuit 40 remains inactive.

Since refresh command signal /REFE remains inactive, output signal φA12 that is output from NAND gate 55 in command-signal activating circuit 50 is at an H level. Accordingly, output signal φA11 that is output from flip-flop 52 remains at the L level. Consequently, refresh flag signal Refflag that is output from command-signal activating circuit 50 becomes active at time t3 and thereafter.

As described above, within a period in which chip enable signal /CE is active, determination circuit 60 determines that refresh operation is not to be executed. When refresh flag signal Refflag that is be output from command-signal activating circuit 50 to activate refresh command signal /REFE is activated within the period for which determination circuit 60 determines that refresh operation is not to be executed, the refresh flag signal Refflag remains active.

Subsequently, chip enable signal /CE is deactivated at a time t4, and complete-hidden-refresh-function-included DRAM thereby enters a standby state. In this case, determination circuit 60 determines that refresh operation is executable, and consequently, determination signal Refwin that is output from determination circuit 60 is activated.

In the above stage, since refresh flag signal Refflag is activated at time t3 and thereafter, signal /REFS that is output from NAND gate 44 in refresh circuit 40 is activated at time t4, and is held active within the specific period of time set by delay circuit 43. Consequently, refresh command signal /REFE that is output from refresh circuit 40 is held active within the specific period of time set by delay circuit 49.

At a time t5, which is a time point after passage of the specific period of time set by delay circuit 49 from time t4, refresh command signal /REFE is deactivated, and in response to the deactivation of refresh command signal /REFE, refresh flag signal Refflag is also deactivated.

Also at and after time t5, refresh flag signal Refflag is activated within a period in which determination circuit 60 determines that refresh operation is executable, refresh circuit 40 activates refresh command signal /REFE in response to refresh flag signal Refflag.

As a result of the above-described operations, when chip enable signal /CE is active, that is, when the complete-hidden-refresh-function-included DRAM is active, determination circuit 60 determines that refresh operation is not to be executed. Thereby, no external read-or-write operation request is input during the refresh operation, and read-or-write operation is performed after completion of refresh operation. Consequently, a conventionally occurred delay in access does not occur. In addition, since a refresh operation and a read-or-write operation are not required to be performed with the same timing, no arbitration circuit need, and in addition, the stability of circuit if the complete-hidden-refresh-function-included DRAM is increased.

Furthermore, when cycle signal /Refcyc that is output from timer circuit 51 within a period for which determination circuit 60 determines that refresh operation is not to be executed, is activated, refresh flag signal Refflag is remained in the active state. That is, the complete-hidden-refresh-function-included DRAM enters a state of awaiting refresh operation. Consequently, when determination circuit 60 determines that refresh operation is executable, the refresh operation can be immediately started. In this case, although a slight deviation occurs in the refresh cycle, the refresh operation can be securely executed in response to the activation of the cycle signal /Refcyc; that is, the refresh operation is not skipped.

[Second Embodiment]

In the above, although the first embodiment of the present invention has been described, the present invention is not limited thereby, and it may be carried out in different embodiments including that as described below by way of the second embodiment.

Figure 6:
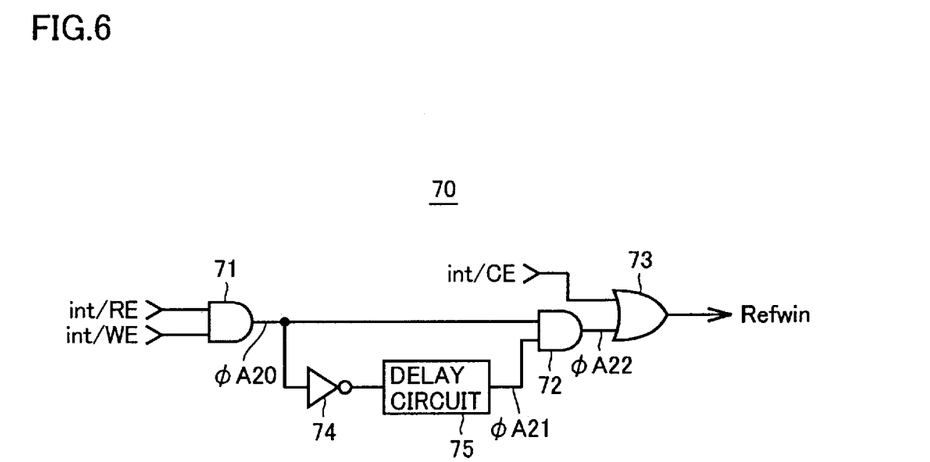
FIG. 6 is a circuit diagram of a determination circuit 70 used instead of determination circuit 60 in a second embodiment of the present invention.

FIG. 6 is a circuit diagram of a determination circuit 70 used as a substitute of determination circuit 60 in the second embodiment of the present invention.

Referring to FIG. 6, determination circuit 70 includes AND gates 71 and 72, an OR gate 73, an inverter 74, and a delay circuit 75.

AND gate 71 receives an internal read enable signal int/RE and an internal write enable signal int/WE, performs operations to obtain a logical product of these signals, and outputs the operation result as a signal $\phi A20$. A control circuit 20 receives output enable signal /OE internally input through input terminal group 10, and generates internal read enable signal int/RE. In addition, control circuit 20 receives write enable signal /WE internally input through input terminal group 10, and generates internal write enable signal int/WE.

Inverter 74 receives signal $\phi A20$, which has been output from AND gate 71, and inverts it. Delay circuit 75 receives an inverted signal of signal $\phi A20$, which has been output from inverter 74, and outputs a signal $\phi A21$ delayed by a specific time.

AND gate 72 receives signal $\phi A20$, which has been output from AND gate 71. It also receives signal $\phi A21$, which has been output from delay circuit 75. Then, AND gate 72 performs operations to obtain a logical product thereof, and outputs the result as a signal $\phi A22$.

OR gate 73 receives signal $\phi A22$, which has been output from AND gate 72, and internal chip enable signal int/CE. Then, OR gate 73 performs operations to obtain a logical product of signal $\phi A22$ and internal chip enable signal int/CE, and outputs the result as determination signal Refwin. Control circuit 20 receives chip enable signal /CE that has been output from input terminal group 10, and generates internal chip enable signal int/CE.

Hereinbelow, the above-described configuration of fresh circuit 40 including determination circuit 70 will be described.

Figure 7:
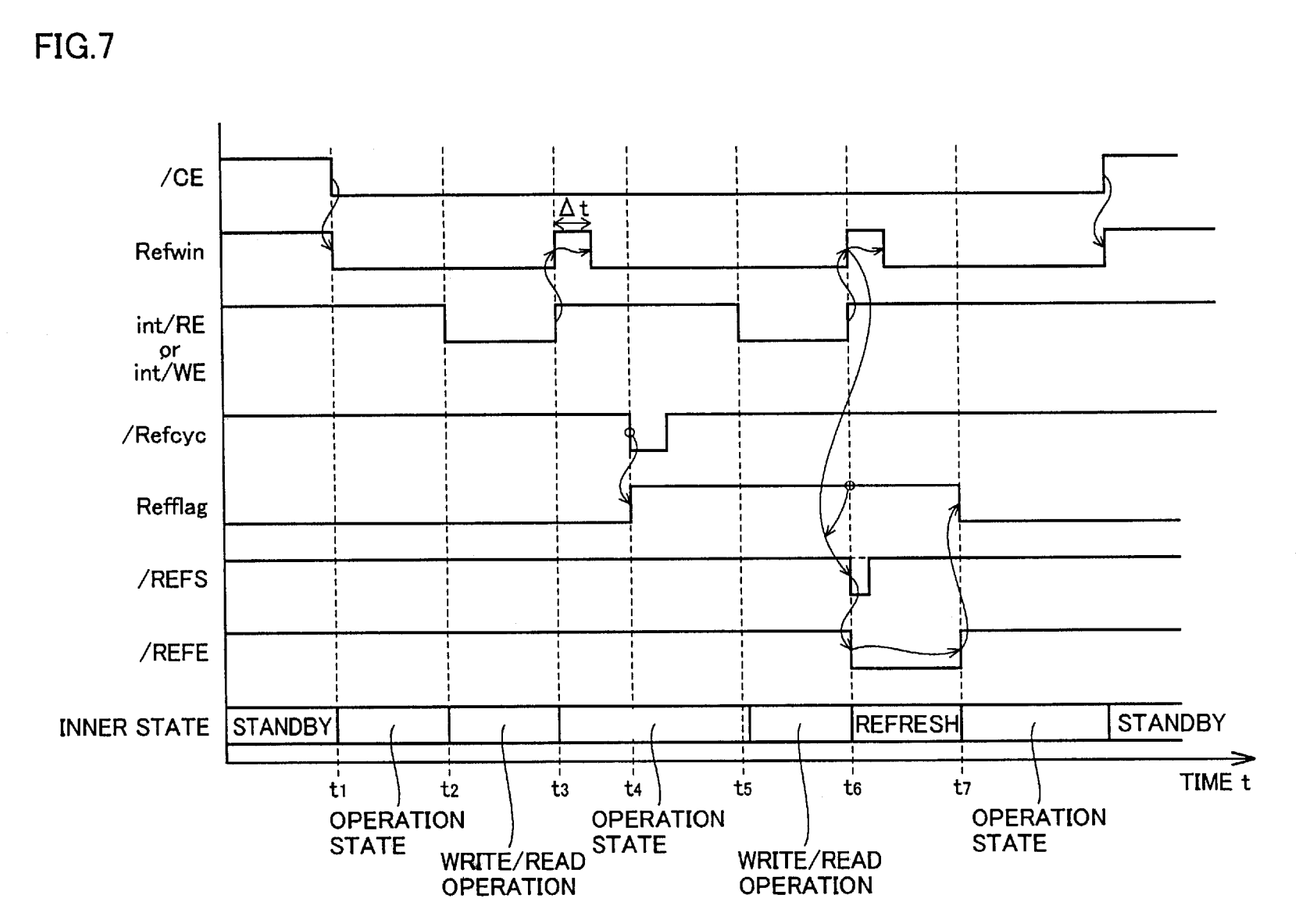
FIG. 7 is a timing chart representing operation of refresh circuit 40 including determination circuit 70.

FIG. 7 is a timing chart representing operation of refresh circuit 40 including determination circuit 70.

Referring to FIG. 7, chip enable signal /CE is activated at a time t1. At this time, complete-hidden-refresh-function-included DRAM is activated and enters an operation state. At time t1, since internal read enable signal int/RE or internal write enable signal int/WE is inactive, the level of signal $\phi A22$ that is output from AND gate 72 in determination circuit 70 becomes an L level. Consequently, determination signal Refwin that is output from OR gate 73 in determination circuit 70 is deactivated.

Subsequently, at a time t2, internal read enable signal int/RE or internal write enable signal int/WE is activated, and thereby, a read-or-write operation is executed. At this time, the level of signal $\phi A20$ that is output from AND gate 71 in determination circuit 70 becomes an L level; and the level of signal $\phi A21$ that is output from delay circuit 75 is an H level. Consequently, the level of signal $\phi A22$, which is output from AND gate 72, is the L level. Thereby, determination signal Refwin, which is output from OR gate 73, is maintained inactive.

Subsequently, at a time t3, internal read enable signal int/RE or internal write enable signal int/WE is deactivated, and the read-or-write operation is terminated. At this time, the level of signal $\phi A20$, which is output from AND gate 71 in determination circuit 70, becomes an H level. On the other hand, signal $\phi A21$, which is output from delay circuit 75, is maintained at the H level within a specific period of time $\Delta t$, which is a time point after passage of a specific time from time t3. Thereby, the level of signal $\phi A22$, which is output from AND gate 72, becomes an H level within specific period of time $\Delta t$ after time t3. Consequently, determination signal Refwin, which is output from OR gate 73, is maintained active within specific period of time $\Delta t$ after time t3. As a result of the above-described operations, determination circuit 70 determines that refresh operation is executable within specific period of time $\Delta t$ after completion of a read-or-write operation.

At time t3, while determination signal Refwin is activated, cycle signal /Refcyc is inactive. Accordingly, refresh flag signal Refflag that is output from command-signal activating circuit 50 is also inactive. Consequently, refresh command signal /REFE that is output from refresh circuit 40 is inactive at time t3.

Subsequently, when cycle signal /Refcyc is activated at time t4, refresh flag signal Refflag, which is output from command-signal activating circuit 50, becomes active. At this time, determination signal Refwin, which is output from determination circuit 70, is inactive. Consequently, refresh command signal /REFE, which is output from refresh circuit 40, remains inactive. Also, refresh flag signal Refflag, which is output from command-signal activating circuit 50, is maintained active at time t4 and thereafter.

Subsequently, when a read-or-write operation is restarted at a time t5, and the read-or-write operation terminates at a time t6, determination signal Refwin that is output form determination circuit 70 at time t6 becomes active at specific period of time $\Delta t$ after time t6 as in the case of time t4.

In the above case, at time t4 and thereafter, refresh flag signal Refflag remains active. Accordingly, signal /REFS that is output from NAND gate 44 in refresh circuit 40 becomes active within the specific period of time set by delay circuit 43. Consequently, refresh command signal /REFE, which is output from refresh circuit 40, becomes active within the specific period of time set by delay circuit 49 at and after time t6. Thereby, refresh operation is executed. When refresh command signal /REFE is deactivated at a time t7, also refresh flag signal Refflag is deactivated in response to the deactivation.

As a result of the above-described operations, determination circuit 70 determines that refresh operation is executable within the specific period of time after the completion of a read-or-write operation. Therefore, in the case where determination circuit 70 determines that refresh operation is executable, when refresh flag signal Refflag is active, refresh command signal /REFE is activated. In specific, the semiconductor memory device according to the second embodiment performs a refresh operation after completion of a write-or-read operation. Therefore, in the semiconductor memory device of the second embodiment, even when it is in an operation state, a refresh operation and a read-or-write operation are not executed with the same timing. Furthermore, even when the period in which chip enable signal /CE is active is long, the semiconductor memory device enables the prevention of data breakdown that can occur when refresh operation is not executed for the long time. Still furthermore, since the refresh operation is securely executed after a write-or-read operation, high-speed access can be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having an operation state where a read operation and a write operation for data are executable and a standby state where said data is retained, comprising:
   a memory cell array including a plurality of memory cells arranged in a matrix; and
   a complete hidden refresh circuit for performing a refresh operation without being externally commanded for said data stored in said plurality of memory cells;
   wherein said complete hidden refresh circuit executes said refresh operation according to the condition of said semiconductor memory device; and
   wherein said complete hidden refresh circuit includes:
      a refresh circuit for outputting a refresh command signal for execution of said refresh operation; and
      a control circuit for executing said refresh operation in response to said refresh command signal; and
   wherein said refresh circuit includes:
      a timer circuit for outputting a cycle signal at a time interval necessary for refreshing data stored in said plurality of memory cells;
      a command-signal activating circuit for activating said refresh command signal in response to said cycle signal; and
      a determination circuit for determining as to whether or not said refresh command signal activated is to be output.

2. The semiconductor memory device according to claim 1, wherein said determination circuit determines that said refresh command signal activated is to be output when said semiconductor memory device is in said standby state.

3. The semiconductor memory device according to claim 1, wherein said determination circuit determines that said refresh command signal activated is to be output after said semiconductor memory device has completed said read operation.

4. The semiconductor memory device according to claim 1, wherein said determination circuit determines that said refresh command signal activated is to be output after said semiconductor memory device has completed said write operation.

5. The semiconductor memory device according to claim 1, wherein said determination circuit determines that said refresh command signal activated is to be output, based on an inactive state of an external control signal defining said operation state.

6. The semiconductor memory device according to claim 1, wherein said determination circuit determines that said refresh command signal activated is to be output, based on an inactive state of an external control signal defining said read operation in said operation state.

7. The semiconductor memory device according to claim 1, wherein said determination circuit determines that said refresh command signal activated is to be output, based on an inactive state of an external control signal defining said write operation in said operation state.

8. A semiconductor memory device having an operation state where a read operation and a write operation for data are executable, comprising:
   a memory cell array including a plurality of memory cells arranged in a matrix;
   an address select circuit for selecting a memory cell among said plurality of memory cells;
   a refresh circuit for outputting a refresh command signal designating a refresh operation for said plurality of memory cells; and
   a control circuit for controlling said address select circuit and executing said refresh operation according to said refresh command signal, wherein
      said refresh command signal is not externally input to said semiconductor memory device, and
      said refresh circuit includes:
         a timer circuit generating internally a cycle signal periodically in said semiconductor memory device,
         a first refresh control circuit for activating a first refresh control signal based on said cycle signal,
         a second refresh control circuit for activating a second refresh control signal based on completion of said read operation, and
         a signal output circuit for outputting said refresh command signal according to activated said first and second refresh control signals.

9. The semiconductor memory device according to claim 8, wherein said second refresh control signal is output for a specific period as a pulse signal after said completion of said read operation.

10. A semiconductor memory device having an operation state where a read operation and a write operation for data are executable, comprising:
   a memory cell array including a plurality of memory cells arranged in a matrix;
   an address select circuit for selecting a memory cell among said plurality of memory cells;
   a refresh circuit for outputting a refresh command signal designating a refresh operation for said plurality of memory cells; and
   a control circuit for controlling said address select circuit and executing said refresh operation according to said refresh command signal, wherein
      said refresh command signal is not externally input to said semiconductor memory device, and
      said refresh circuit includes:
         a timer circuit generating internally a cycle signal periodically in said semiconductor memory device,
         a first refresh control circuit for activating a first refresh control signal based on said cycle signal,
         a second refresh control circuit for activating a second refresh control signal based on completion of said write operation, and
         a signal output circuit for outputting said refresh command signal according to activated said first and second refresh control signals.

11. The semiconductor memory device according to claim 10, wherein said second refresh control signal is output for a specific period as a pulse signal after said completion of said write operation.

* * * * *

UNITED STATES PATENT AND TRADEMARK OFFICE
CERTIFICATE OF CORRECTION

PATENT NO. : 6,697,910 B2
DATED : February 24, 2004
INVENTOR(S) : Masaki Tsukude et al.

It is certified that error appears in the above-identified patent and that said Letters Patent is hereby corrected as shown below:

<u>Title page,</u>
Item [73], Assignee, change "Rensos" to -- Renesas --

Signed and Sealed this

Twenty-ninth Day of June, 2004

JON W. DUDAS
*Acting Director of the United States Patent and Trademark Office*